United States Patent
Ridgers

Patent Number: 6,052,009
Date of Patent: Apr. 18, 2000

[54] D-TYPE FLIPFLOP

[75] Inventor: Timothy Ridgers, Bretteville l'Orgueilleuse, France

[73] Assignee: U.S. Philips Corporation, New York, N.Y.

[21] Appl. No.: 08/995,472

[22] Filed: Dec. 22, 1997

[30] Foreign Application Priority Data

Dec. 31, 1996 [FR] France ..................................... 9616263

[51] Int. Cl.[7] ................................................. H03K 3/289
[52] U.S. Cl. ........................... 327/202; 327/214; 327/218
[58] Field of Search .................................. 327/199, 200, 327/201, 202, 203, 208–214, 218, 223

[56] References Cited

U.S. PATENT DOCUMENTS

| 5,027,005 | 6/1991 | Kitsuta et al. ........................... 327/208 |
| 5,220,212 | 6/1993 | Sihn ........................................ 327/202 |
| 5,289,119 | 2/1994 | Schroeder et al. .................. 324/158 T |
| 5,661,426 | 8/1997 | Ichimaru ................................. 327/203 |

Primary Examiner—Tuan T. Lam
Attorney, Agent, or Firm—Brian J. Wieghaus

[57] ABSTRACT

A flipflop, which is realized in an ECL or CML technique, has an internal output for the logic signal in a symmetrical mode and is provided with two transistor followers for supplying the two output signal components from the internal output, and each of these two transistor followers is one of the transistors of an enforcing pair, while the base of the other transistor is connected to a test signal input.

7 Claims, 2 Drawing Sheets

2

D-TYPE FLIPFLOP

BACKGROUND OF THE INVENTION

The invention relates to a D-type flipflop which can be realized in an ECL or CML technique, comprising a first pair of transistors constituting a first semi-flipflop, supplying a first logic signal at a first couple of logic connections, a second pair of transistors constituting a second semi-flipflop, supplying a second logic signal at a second couple of logic connections, the two pairs being coupled together for jointly constituting a complete flipflop, the second couple of logic connections constituting an internal output of the logic signal of the flipflop in a symmetrical mode.

The invention also relates to a charge-pump circuit and to an integrated circuit.

The acronyms ECL and CML stand for "Emitter Coupled Logic" and "Current Mode Logic", respectively. When a "pair of transistors" is mentioned, always two transistors are concerned, having their emitters jointly connected to a current source.

When a flipflop is used in a complex circuit, it is sometimes difficult to verify the operation of this circuit in all possible cases.

SUMMARY OF THE INVENTION

It is, inter alia, an object of the invention to provide a flipflop which, without complicating its structure, facilitates the test of a complex circuit in which it is incorporated, by imposing a desired state on this circuit.

To this end, the flipflop comprises two transistor followers for supplying two output signal components from the internal output, and each of these two transistor followers is one of the transistors of an enforcing pair, while the base of the other transistor of the pair is connected to a test signal input.

The base of a transistor of an enforcing pair is preferably connected to one of the logic connections constituting the internal output, while the collector of the other transistor of the same pair is connected to the other connection.

This provides the possibility of obtaining two complementary states at the outputs.

The flipflop also advantageously has a control input which is connected to the bases of a pair of control transistors having their collectors connected to the two respective conductors of the first couple of logic connections, and the emitters of the control transistors are jointly connected to the collector of a transistor of a pair of transistors having their bases connected to the output connections of the flipflop.

This provides the possibility of inhibiting the operation of the flipflop on request.

A charge-pump circuit, possibly included in an integrated circuit, advantageously comprises at least a flipflop according to the invention.

In any integrated circuit comprising a flipflop as described in the opening paragraph, this flipflop may be advantageously a flipflop according to the invention.

These and other aspects of the invention are apparent from and will be elucidated with reference to the embodiments described hereinafter.

DESCRIPTION OF THE PREFERRED EMBODIMENTS

Figure 1:
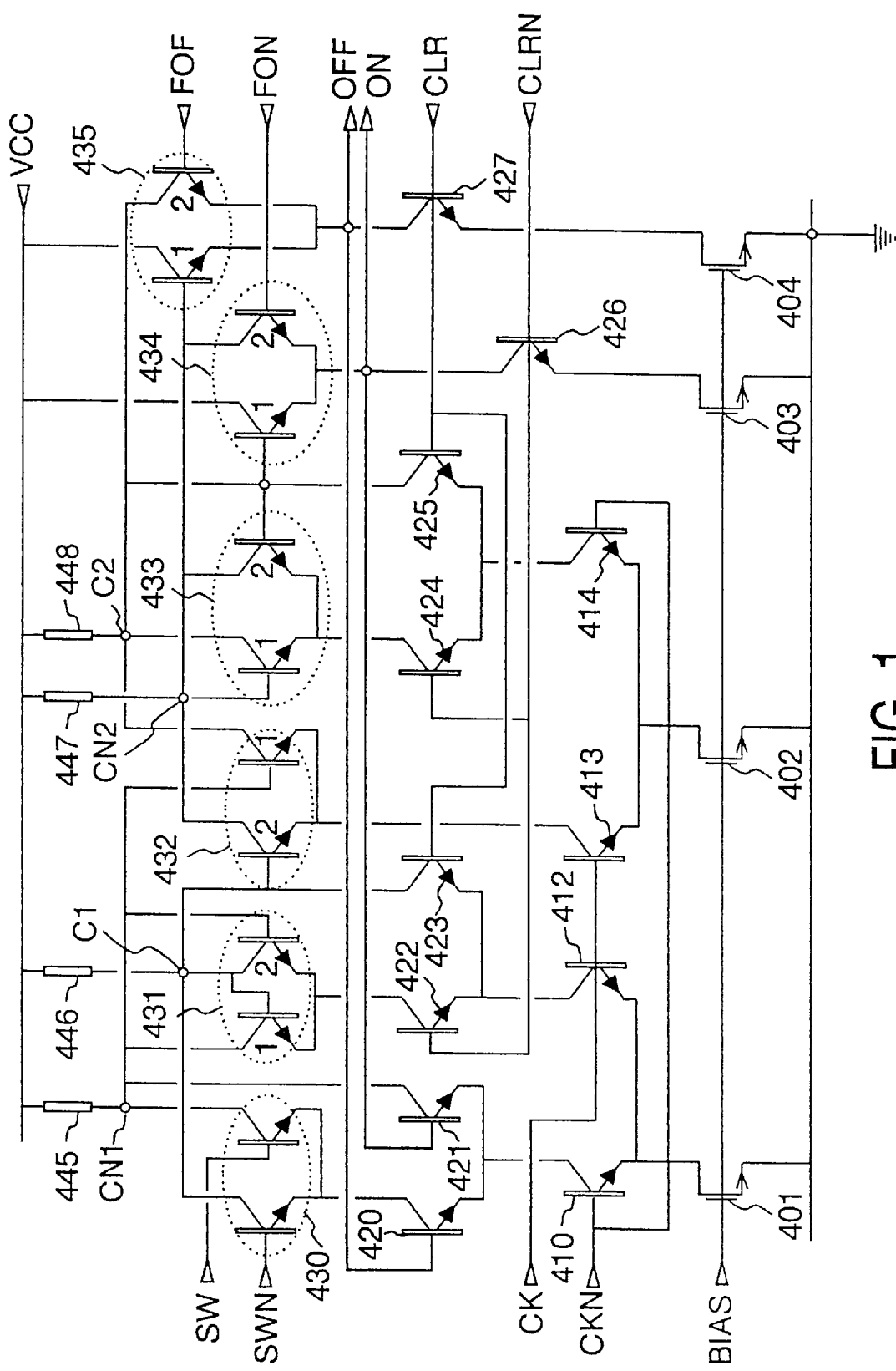
FIG. 1 is a detailed circuit diagram of an embodiment of a flipflop according to the invention.

The flipflop shown in FIG. 1 is realized with the aid of differential CML gates. It is provided with two MOS transistors 401 and 402 which are biased by a voltage BIAS and serve as a tail resistance for two pairs 410/412 and 413/414, both controlled at the input by a symmetric clock signal CK/CKN. The collector of the transistor 412 feeds a current to a pair of transistors 422/423 which are switched by the connection of their bases to a symmetric signal CLR/CLRN defining a state. The collector of the transistor 413 feeds a current to a pair 432, and that of transistor 414 feeds a current to a pair of transistors 424/425 which are also switched by the connection of their bases to the symmetric signal CLR/CLRN. The collector of the transistor 422 feeds a current to a pair 431. The collector of a first transistor of the pair 431 and the base of the other transistor as well as the base of a first one of the transistors of the pair 432 are connected to a connection CN1 which is connected to the power supply VCC via a resistor 445. The collector of the second transistor and the base of the first transistor of the pair 431 as well as the base of the second transistor of the pair 432 are connected to a connection C1 which is connected to the power supply VCC via a resistor 446. The collector of a first transistor and the base of the other transistor of a pair 433 as well as the collector of the first transistor of the pair 432 are connected to a connection C2 which is connected to the power supply VCC via a resistor 448. The collector of the second transistor and the base of the first transistor of the pair 433 as well as the collector of the second transistor of the pair 432 are connected to a connection CN2 which is connected to the power supply VCC via a resistor 447.

The collector of the transistor 423 is connected to the connection C1, that of the transistor 424 feeds a current to the pair 433 and that of the transistor 425 is connected to the connection C2. The flipflop thus comprises a first pair of transistors 431 constituting a first semi-flipflop supplying a first logic signal at a first couple of logic connections C1, CN1, a second pair of transistors 433 constituting a second semi-flipflop, supplying a second logic signal at a second couple of logic connections C2, CN2, the two pairs being coupled together by means of a pair 432, jointly constituting a complete flipflop, and the second couple of logic connections C2, CN2 constituting an internal output of the logic signal of the flipflop in a symmetrical mode.

Two MOS transistors 403, 404 are biased by the voltage BIAS. When the power supply voltage is less than approximately 3.5 V, these transistors serve as resistors defining the current for transistors 426, 427 constituting current sources and serving as a tail resistance for a pair 434 and a pair 435. As in this case, the bases of the transistors 426, 427 may be connected to the connection CLR/CLRN if the topography of the circuit simplifies this connection, but this connection does not play any functional role because the voltage CLR, CLRN always stays at such a value that the transistors remain conducting. Based on the diagram shown, the bases of the transistors 426, 427 may also be disconnected from the inputs CLR/CLRN and jointly connected, for example to the power supply VCC via two series diodes and to ground via a resistor.

The transistors 434-1 and 435-1, operating as emitter followers, supply the output signals ON and OFF, i.e. the two components of the output signal from the internal output C2/CN2, and each of these two transistor followers is one of the transistors of an enforcing pair, while the base of the other transistors 434-2 and 435-2 is connected to a test signal input FON and FOF, respectively. The base of the transistor 435-1 of the pair of enforcing transistors 435 is connected to the logic connection CN2 constituting an internal semi-output, while the collector of the other transistor 435-2 of the same pair 435 is connected to the other connection C2. The reciprocal applies mutatis mutandis to the pair 434.

An enforcement could be obtained by means of the connections CLR/CLRN, but the possibilities would then be reduced: only a single state could be enforced and one could only act on all the flipflops at a time because the connection CLR/CLRN is a common connection so that one action on the pairs 434, 435 provides all the combinations.

The signals FON and FOF are normally low signals and the second transistors of the pairs 434 and 435 are cut and do not modify the operation at all. In the test mode, one or the other of these signals is given the active state and the respective output changes to the state "1", irrespective of the positioning of the flipflop. Since the collector of the transistor 434-2 is connected to the connection CN2, i.e. the output which is opposite with respect to the output ON controlled by 434-1, the passage of current through this transistor imposes a voltage drop in the resistor 447, such that the opposite output is simultaneously set at the zero state. The reciprocal applies mutatis mutandis to the pair 435. All this provides the possibility of verifying different characteristics of the circuit in which the flipflop is used, by forcing certain elements to a stable known state.

The flipflop also has a control input SW/SWN which is connected to the bases of a pair of control transistors 430 having their collectors connected to the two conductors C1 and CN1, respectively, of the first couple of logic connections. The emitters of these control transistors 430 are connected to the collector of a transistor 420 of a pair of transistors 420/421, fed by the transistor 410, and whose bases are connected to the output connections ON/OFF of the flipflop. The collector of the transistor 421 is connected to the connection CN1. The gates 431, 432 need the prepositioning of the signal SW/SWN: this signal allows the use of only an edge of the signal CK/CKN per comparison period, while the others are not accepted. The choice of the active edge is made by a counter (outside the circuit) which applies a selection pulse to the input SW/SWN of the flipflop. The comparison frequency is thus a sub-multiple of the frequency of an oscillator signal applied to the input CK/CKN. From the instant when the flipflop is activated, the state is maintained during the subsequent clock cycles, even if the input SW is reset again, as long as the input CLR/CLRN has not reset it.

Figure 2:
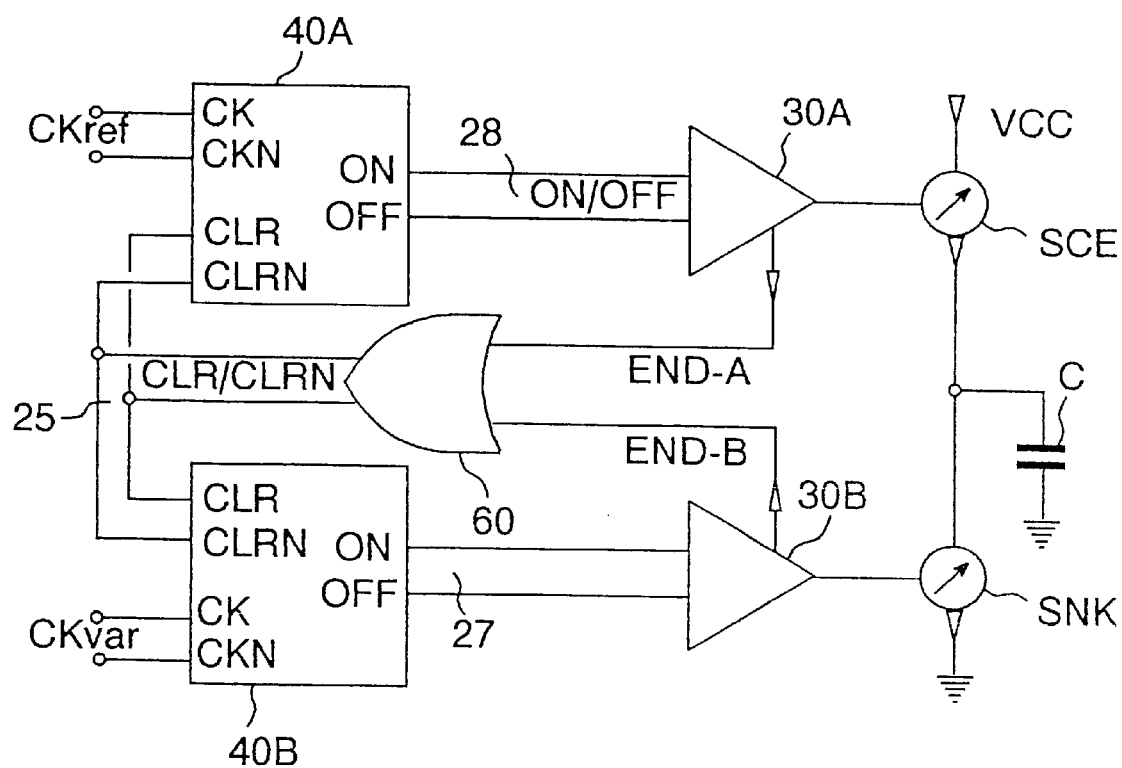
FIG. 2 shows diagrammatically a charge pump provided with flipflops according to the invention.

FIG. 2 shows the overall structure of a charge pump branched between a power supply VCC and ground. It has an output stage consisting of a current source SCE and a current sink SNK. The currents of these two sources SCE and SNK are substracted to each other in a capacitor C having a charge which represents the output voltage of the pump. A control circuit 30A, 30B is used for controlling the current in each of the sources SCE, SNK, respectively. A symmetric signal Ckvar to be compared is applied to the clock input CK, CKN of a flipflop 40B conform to that of FIG. 1, and a symmetric pilot signal Ckref is applied to an input CK, CKN of another flipflop 40A of the same type. These D-type flipflops may be not entirely D-flipflops: they trigger at a clock pulse CK/CKN but are reset to their initial state by the asynchronous command CLR/CLRN. The pulsation of the output current of each control circuit 30A, 30B is initiated by the output ON/OFF of each flipflop 40A, 40B. When the current in the two sources SCE and SNK is established, the control circuits 30A and 30B both apply a signal END-A and END-B, respectively, to a gate 60 of the OR type whose output signal CLR/CLRN is applied to the inputs CLR/CLRN of the two flipflops, which triggers them at the next clock signal.

What is claimed is:

1. A D-type flipflop which is realized in an ECL or CML technique, comprising a first pair of transistors constituting a first semi-flipflop, supplying first logic signals at a first couple of logic connections, a second pair of transistors constituting a second semi-flipflop, supplying second logic signals at a second couple of logic connections, the two pairs being coupled together for jointly constituting a complete flipflop, the second couple of logic connections constituting internal outputs of the flipflop in a symmetrical mode, characterized in that the flipflop comprises a pair of two-transistor followers for supplying two output signal components from the internal outputs, and each of these two-transistor followers is having an enforcing transistor, and the base of the other transistor of the pair is connected to a test signal input.

2. A flipflop as claimed in claim 1, characterized in that the base of the enforcing transistor is connected to one of the internal outputs, while the collector of the other transistor of said enforcing transistor is connected to another of the internal outputs.

3. A flipflop as claimed in claim 1, further comprising control input which is connected to bases of a pair of control transistors having their collectors connected to the two respective first couple of logic connections.

4. A flipflop as claimed in claim 3, characterized in that the emitters of the control transistors are jointly connected to the collector of a transistor of a pair of transistors having their bases connected to the output of the two output signal components.

5. A charge-pump circuit, characterized in that it comprises a D-type flipflop which is realized in an ECL or CML technique, comprising a first pair of transistors constituting a first semi-flipflop, supplying first logic signals at a first couple of logic connections, a second pair of transistors constituting a second semi-flipflop, supplying second logic signals at a second couple of logic connections, the two pairs being coupled together for jointly constituting a complete flipflop, the second couple of logic connections constituting internal outputs signals of the flipflop in a symmetrical mode, characterized in that the flipflop comprises a pair of two-transistor followers for supplying two output signal components from the internal outputs, and each of these two-transistor followers having an enforcing transistor, and the base of the other transistor of the pair is connected to a test signal input.

6. An integrated circuit, characterized in that it comprises a charge-pump circuit comprising a D-type flipflop which is realized in an ECL or CML technique, comprising a first pair of transistors constituting a first semi-flipflop, supplying first logic signals at a first couple of logic connections, a second pair of transistors constituting a second semi-flipflop, supplying second logic signals at a second couple of logic connections, the two pairs being coupled together for jointly constituting a complete flipflop, the second couple of logic connections constituting internal outputs signals of the flipflop in a symmetrical mode, characterized in that the flipflop comprises a pair of two-transistor followers for supplying two output signal components from the internal outputs, and each of these two-transistor followers having an enforcing transistor, and the base of the other transistor of the pair is connected to a test signal input.

7. An integrated circuit comprising a flipflop, characterized in that said flipflop is a D-type flipflop which is realized in an ECL or CML technique, comprising a first pair of transistors constituting a first semi-flipflop, supplying first logic signals at a first couple of logic connections, a second pair of transistors constituting second semi-flipflop, supplying a second logic signals at a second couple of logic connections, the two pairs being coupled together for jointly constituting a complete flipflop, the second couple of logic connections constituting internal outputs of the flipflop in a symmetrical mode, characterized in that the flipflop comprises a pair of two-transistor followers for supplying two output signal components from the internal outputs, and each of these two-transistor followers having an enforcing transistor, and the base of the other transistor of the pair is connected to a test signal input.

* * * * *